(12) United States Patent
Zhang et al.

(10) Patent No.: US 7,772,682 B1
(45) Date of Patent: Aug. 10, 2010

(54) MOISTURE PROTECTION METAL ENCLOSURE

(75) Inventors: Naiqian Zhang, Charlotte, NC (US); John Cody Bailey, Mebane, NC (US); Dan Carey, Kernesville, NC (US); Michael T. Fresina, Greensboro, NC (US); J. Phillip Conlon, Charlotte, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 791 days.

(21) Appl. No.: 11/548,061

(22) Filed: Oct. 10, 2006

(51) Int. Cl.
*H01L 23/06* (2006.01)
(52) U.S. Cl. .................. 257/684; 257/704; 257/700
(58) Field of Classification Search ............... 257/700, 257/704, 706, 707, 484, 684
See application file for complete search history.

(56) References Cited

U.S. PATENT DOCUMENTS 5,949,654 A * 9/1999 Fukuoka .................. 361/760
6,492,716 B1 * 12/2002 Bothra et al. ............. 257/678
7,138,700 B2 * 11/2006 Tomita et al. ............. 257/529
7,498,203 B2 * 3/2009 Haga et al. ............... 438/122

* cited by examiner

*Primary Examiner*—Steven Loke
*Assistant Examiner*—Kimberly M Thomas
(74) *Attorney, Agent, or Firm*—Withrow & Terranova, P.L.L.C.

(57) ABSTRACT

The present invention provides a substantially hermetically sealed enclosure about an active device area of a semiconductor substrate. The enclosure is created by forming a guard ring around the active device area on the substrate, and forming a metal panel over and in contact with the guard ring to enclose the active device area. The guard ring is a laminate of metal rings formed from alternating metal filled via rings and metal trace rings. The guard ring is formed on an ohmic contact ring on the surface of the substrate. An annealing process may be used to hermetically seal the guard ring to the ohmic contact ring.

7 Claims, 5 Drawing Sheets

MOISTURE PROTECTION METAL ENCLOSURE

FIELD OF THE INVENTION

The present invention relates to semiconductor devices, and more particularly relates to a metal enclosure for moisture protection of active devices within a semiconductor device.

BACKGROUND OF THE INVENTION

Semiconductors are generally manufactured by forming active devices on a semiconductor substrate and then applying one or more dielectric layers over the active devices and the semiconductor substrate. Unfortunately, the active devices are prone to failure when subjected to moisture. Ambient moisture as well as moisture from the manufacturing process readily reaches the active devices through moisture paths created through various material interfaces.

With reference to FIG. 1, an integrated heat sink down (IHSD) configuration for a semiconductor device 10 is provided to illustrate a moisture path 12 to an active device 14. As illustrated, active device 14 is formed on a surface of a substrate 16. A continuous via 18 is used to electrically couple the active device 14 to a metal panel 20, which forms a ground plane and a heat sink. The metal panel 20 and the substrate 16 are separated by one or more dielectric layers 22. The continuous via 18 is formed through the dielectric layers 22.

The continuous via 18 is made up of a sequence of alternating metal-filled vias and metal pads. A first via 24 is formed within the first dielectric layer 26, over and in contact with the active device 14. A first metal pad 28 is created over and in contact with the first via 24. Subsequently, a second via 30 is formed within the second dielectric layer 32, over and in contact with the first metal pad 28. A second metal pad 34 is created over and in contact with the second via 30. A third via 36 is formed within the third dielectric layer 38 between the second metal pad 34 and the metal panel 20. A porous epoxy 40 is used to encapsulate at least a portion of the semiconductor device 10. As illustrated, the epoxy 40 encapsulates the dielectric layers 22, the metal panel 20, and a portion of the substrate 16.

Moisture ingression through metal-dielectric and substrate-dielectric interfaces in a semiconductor device 10 may cause electrical failure over time. As illustrated in FIG. 1, moisture may reach the active device 14 through a moisture path 12 at the junction of the substrate 16 and the first dielectric layer 26. The moisture path 12 is direct and results in moisture reaching the active device 14 in a relatively short period of time. Notably, during the application of the epoxy 40, moisture is often trapped between the epoxy 40 and the dielectric layers 22. The moisture reaches the active device 14 by way of the moisture path 12. Ambient moisture readily passes through the porous epoxy 40 and reached the active device 14 through the moisture path 12.

In an effort to address such moisture issues, traditional integrated heat sink (up) configurations have employed a guard ring 42 about an active device 14 in an active device area 44 of a semiconductor device 10, as illustrated in FIG. 2. However, the guard ring 42 only delays the ingress of moisture to the active device 14 by lengthening the moisture path 12.

The guard ring 42, which is formed from a sequence of alternating metal filled via rings and metal trace rings, creates a partial barrier around the perimeter of the active device 14. Notably, the guard ring 42 does not form a hermetically sealed enclosure about the active device 14. The guard ring 42 is grounded by a ground via 46, which is formed through the substrate 16, to a backside metal panel 48. The backside metal panel 48 is a metal layer formed on the backside of the substrate 16 to assist in providing a ground for the guard ring 42. In this illustration, a first metal-filled via ring 50 is formed within the first dielectric layer 26 on an ohmic contact ring 52. A first metal trace ring 54 is created over and in contact with the first metal-filled via ring 50. Subsequently, a second metal-filled via ring 56 is formed within the second dielectric layer 32, over and in contact with the first metal trace ring 54. A second metal trace ring 58 is created over and in contact with the second metal-filled via ring 56. A third dielectric layer 38 is formed over the second dielectric layer 32 and the second metal trace ring 58.

As shown, the moisture can still reach the active device 14 by circumventing the guard ring 42. Although the moisture path 12 is extended, moisture inevitably reaches the active device 14, and failure of the active device 14 ensues.

Accordingly, there is a need to create an enclosure to significantly reduce or prevent the moisture ingression in a more efficient and effective manner. In particular, there is a need to create a metal enclosure that forms a substantially hermetic seal around the active devices on the surface of the substrate without significantly increasing the cost or complexity of the manufacturing process.

SUMMARY OF THE INVENTION

The present invention provides a substantially hermetically sealed enclosure about an active device area of a semiconductor substrate. The enclosure is created by forming a guard ring around the active device area on the substrate, and forming a metal panel over and in contact with the guard ring to enclose the active device area. As such, the substrate, guard ring, and metal panel form the enclosure about the active device area. The guard ring is a laminate of metal rings formed from alternating metal filled via rings and metal trace rings. The guard ring may be formed on an ohmic contact ring on the surface of the substrate. An annealing process may be used to hermetically seal the guard ring to the ohmic contact ring.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
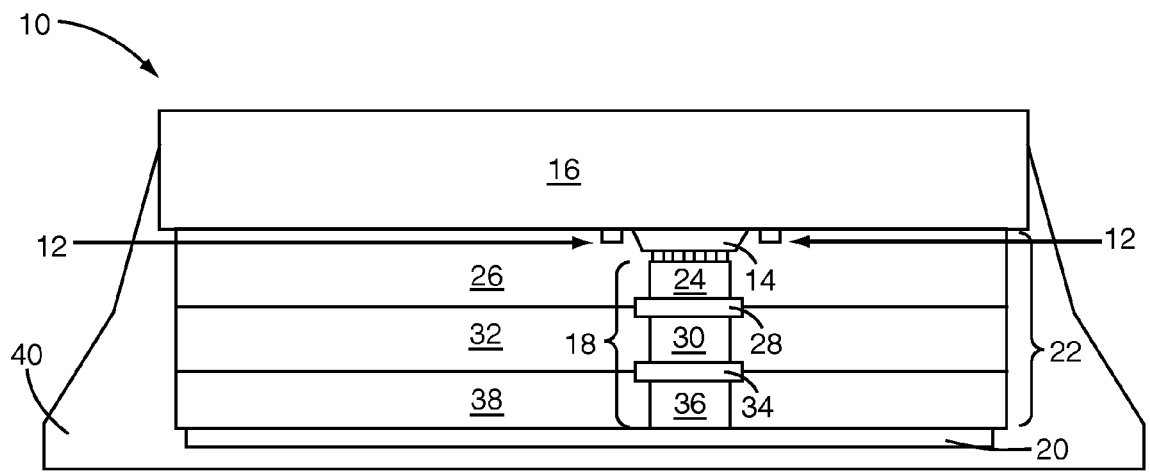
FIG. 1 depicts an integrated heat sink down configuration of a semiconductor device, positioned in a porous epoxy, with a short moisture ingression path according to the prior art.
Figure 2:
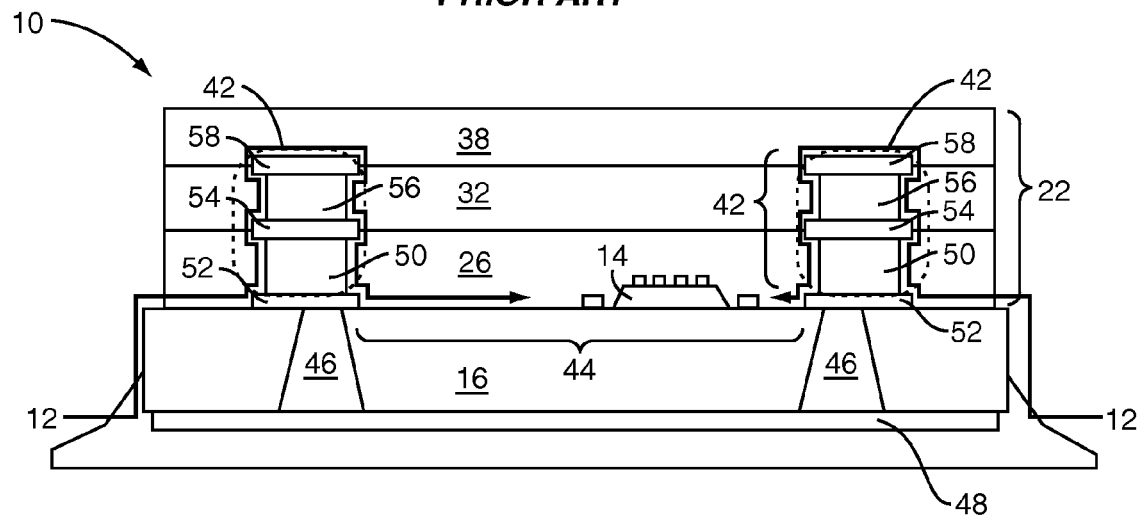
FIG. 2 depicts a traditional grounded guard ring moisture protection for a non-heat sink down configuration of a semiconductor device.
Figure 3:
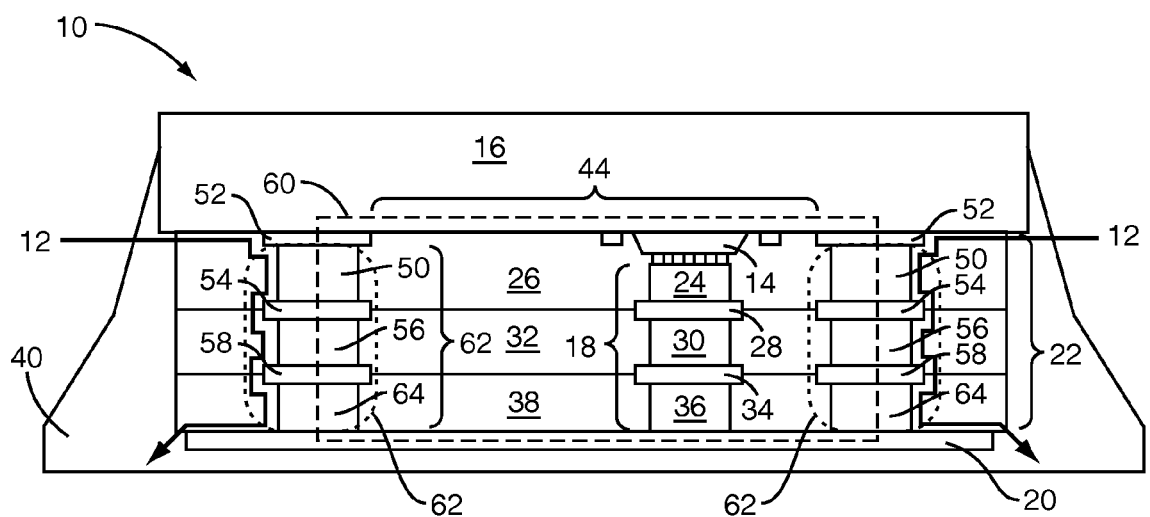
FIG. 3 depicts an integrated heat sink down configuration of a semiconductor device having a moisture protection metal enclosure according to one embodiment of the present invention.

As illustrated in FIG. 3, the present invention provides a substantially hermetically sealed enclosure 60 about an active device area 44 in an integrated heat sink down (IHSD) semiconductor device 10. The active device area 44 is formed on a surface of a substrate 16. The enclosure 60 is created by forming a guard ring 62 around the active device area 44 on the substrate 16, and forming a metal panel 20 over and in contact with the guard ring 62 to enclose the active device area 44. The guard ring 62 is a laminate of metal rings formed from alternating metal filled via rings and metal trace rings. The guard ring 62 may be formed on an ohmic contact ring 52 on the surface of the substrate 16. An annealing process may be used to hermetically seal the guard ring 62 to the ohmic contact ring 52. The enclosure 60 functions to impede the ingression of moisture to an active device 14 in the active device area 44. As depicted, the moisture path 12 does not extend into the active device area 44. Instead, the moisture path 12 extends along the outside of the guard ring 62 and is directed away from the active device area 44.

In the illustrated embodiment, the guard ring 62 is formed in a series of dielectric layers 22 on the surface of the substrate 16. A first metal-filled via ring 50 is formed within a first dielectric layer 26 on the ohmic contact ring 52. A first metal trace ring 54 is formed over and in contact with the first metal-filled via ring 50. Subsequently, a second metal-filled via ring 56 is formed within a second dielectric layer 32, over and in contact with the first metal trace ring 54. A second metal trace ring 58 is formed over and in contact with the second metal-filled via ring 56. A third metal-filled via ring 64 is formed within the third dielectric layer 38. The third metal filled via ring 64 is formed in contact with and between the second metal trace ring 58 and the metal panel 20.

The active device 14 is connected to ground through a continuous via 18, which extends between the metal panel 20 and active device 14. The continuous via 18 is made up of a sequence of alternating metal-filled vias and metal pads. A first via 24 is formed within the first dielectric layer 26, over and in contact with the active device 14. A first metal pad 28 is created over and in contact with the first via 24. Subsequently, a second via 30 is formed within the second dielectric layer 32 over and in contact with the first metal pad 28. A second metal pad 34 is created over and in contact with the second via 30. A third via 36 is formed within the third dielectric layer 38 between the second metal pad 34 and the metal panel 20. The respective layers of the via and trace rings are formed along with the vias and metal pads during the manufacturing process. Further, the continuous via 18 is not required for the present invention.

Figure 4:
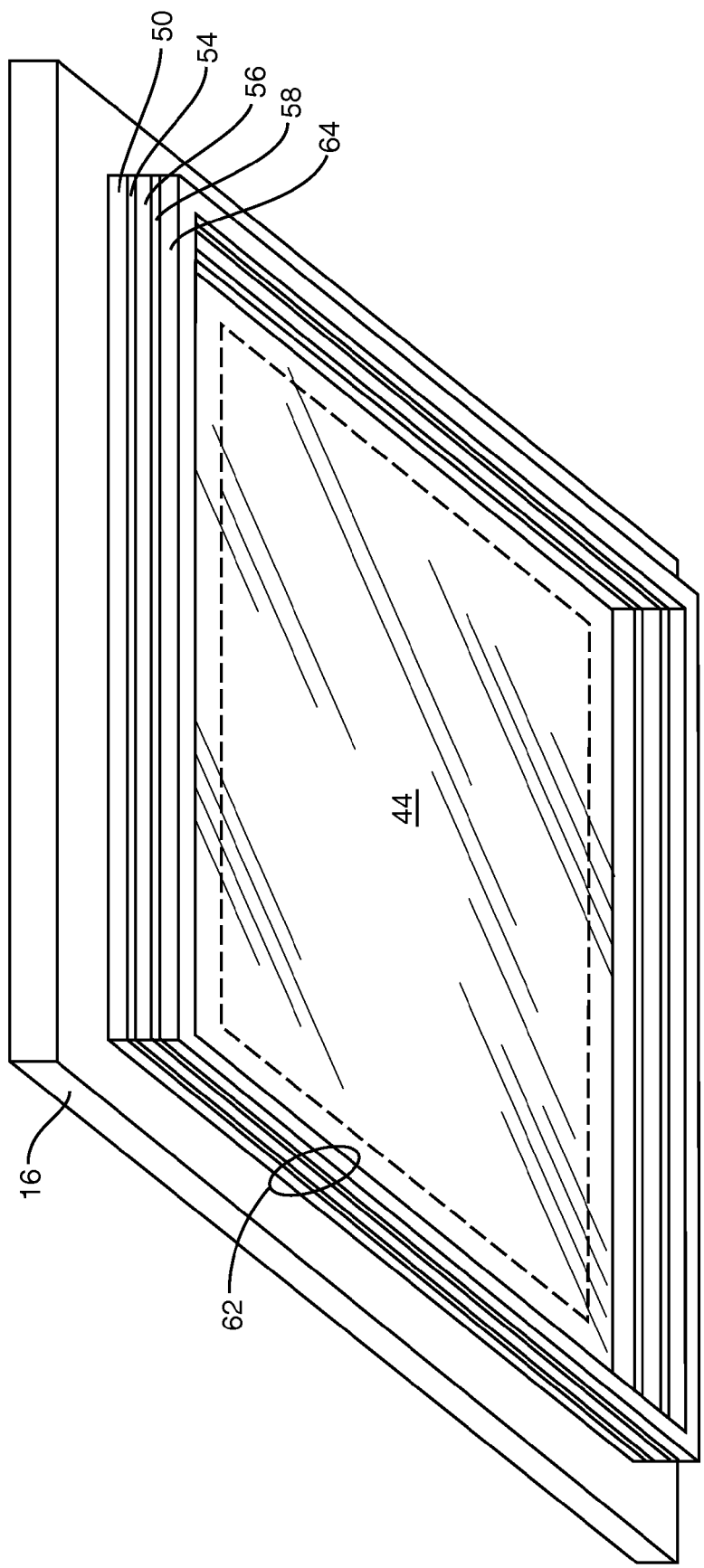
FIG. 4 depicts a perspective representation of the integrated heat sink down configuration of the semiconductor device having a guard ring over the surface of a substrate according to one embodiment of the present invention.

A perspective representation of the guard ring 62 on the substrate 16 is depicted in FIG. 4. This representation shows the guard ring 62 about the active device area 44 on a bottom surface of the substrate 16. To better illustrate the guard ring 62, the active devices 14, dielectric layers 22, metal panel 20, and the continuous via 18 are not shown in this illustration.

Figure 5:
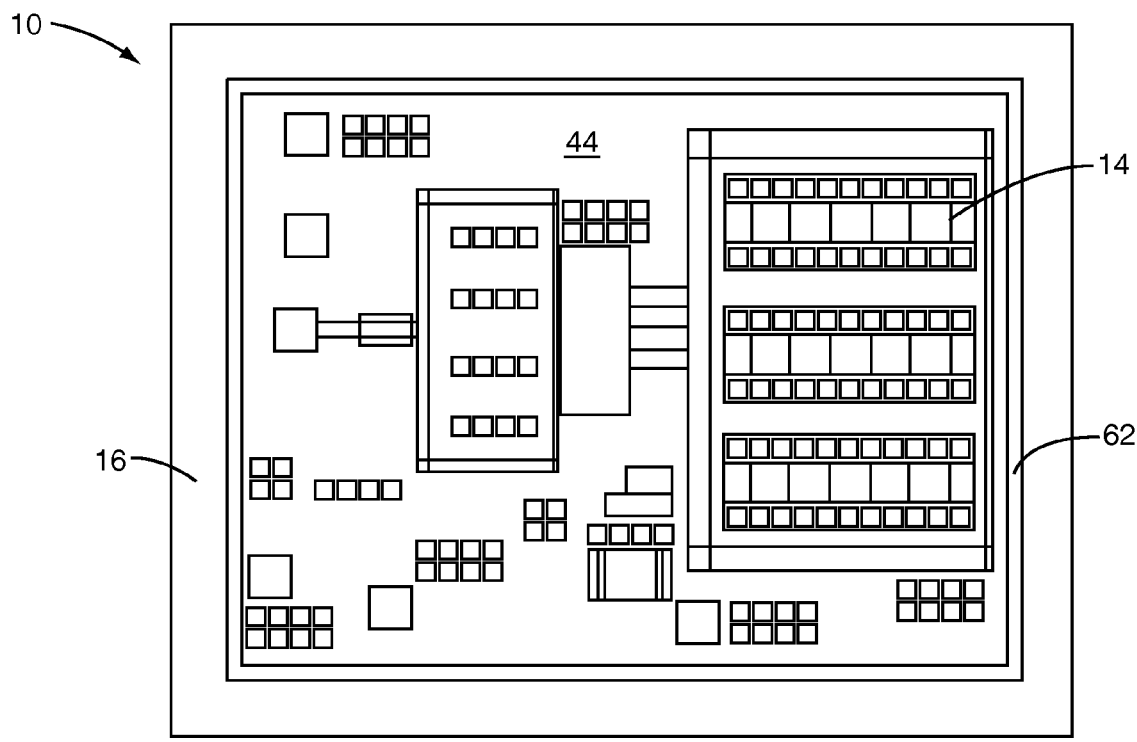
FIG. 5 depicts a bottom view of the guard ring according to one embodiment of the present invention.

In FIG. 5, a bottom view of the IHSD semiconductor device 10 according to one embodiment of the present invention is depicted. The metal panel 20 is transparent in this configuration in order to show the active devices 14, active device area 44, and guard ring 62, which are all beneath the metal panel 20. This view shows the active devices 14 positioned in the active device area 44, which is surrounded by the guard ring 62 on the surface of a substrate 16. The guard ring 62 may be formed in one or more dielectric layers 22 (not shown), between the substrate 16 and the metal panel 20 (not shown). As illustrated, the guard ring 62 is a continuous ring. Alternatively, the guard ring 62 may have one or more gaps, which may be positioned substantially apart from one another to lengthen a path that moisture must travel to reach the active devices 14. The guard ring 62, the substrate 16, and the metal panel 20 (not depicted) provide the hermetically sealed enclosure 60 for the active devices 14.

Figure 6:
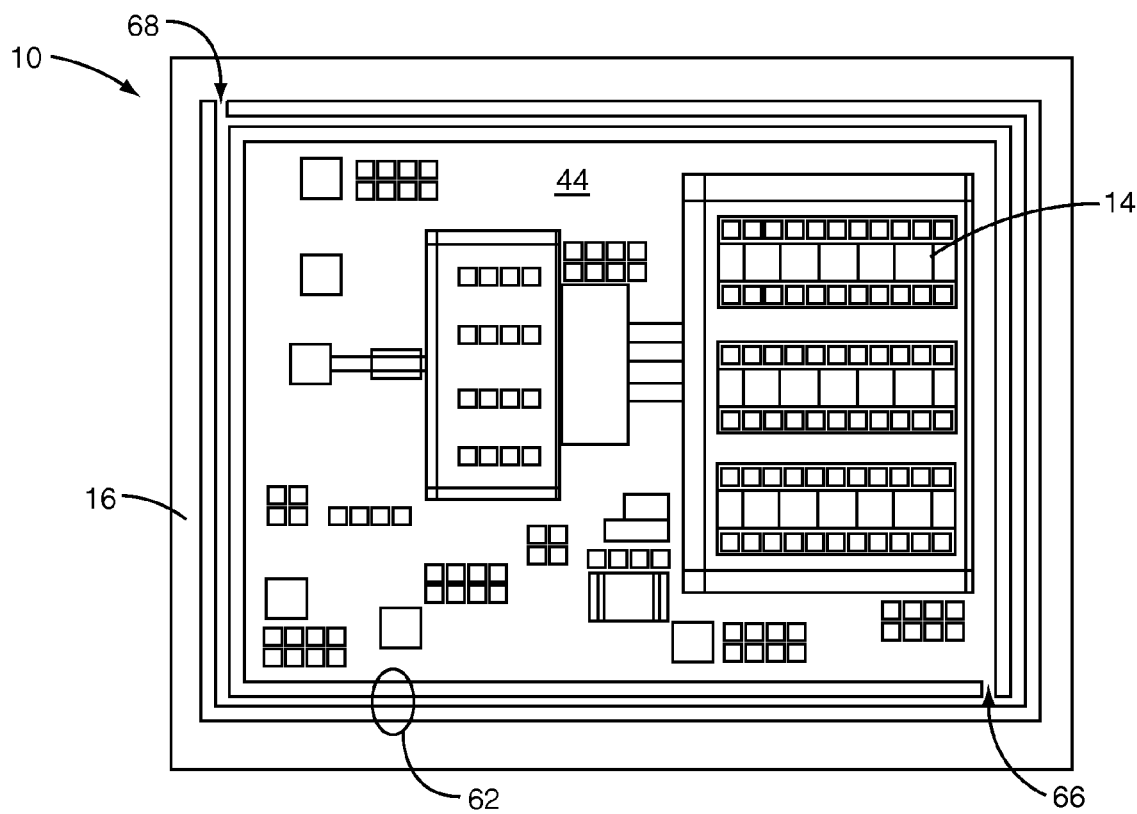
FIG. 6 depicts a top view of the guard ring according to an alternate embodiment of the present invention.

In FIG. 6, a bottom view of the IHSD semiconductor device 10 according to an alternate embodiment of the present invention is depicted. Again, the metal panel 20 is transparent in this configuration in order to show the active devices 14, active device area 44, and guard ring 62, which are all beneath the metal panel 20. This view shows the active devices 14 positioned in the active device area 44, which is surrounded by the guard ring 62 on the surface of a substrate 16. The guard ring 62 may be formed in one or more dielectric layers 22 (not shown), between the substrate 16 and the metal panel 20 (not shown). The guard ring 62 in FIG. 6 is formed by two concentric guard rings 62, each with a gap. The first gap 66 created in one guard ring is preferably substantially apart from the second gap 68 created in the other guard ring. The first gap 66 and the second gap 68 may be positioned substantially apart from one another to lengthen the moisture path 12 that moisture must travel to reach the active devices 14 and prevent moisture from easily entering through both gaps. The guard ring 62, the substrate 16, and the metal panel 20 (not depicted) provide the hermetically sealed enclosure 60 for the active devices 14.

Figure 7:
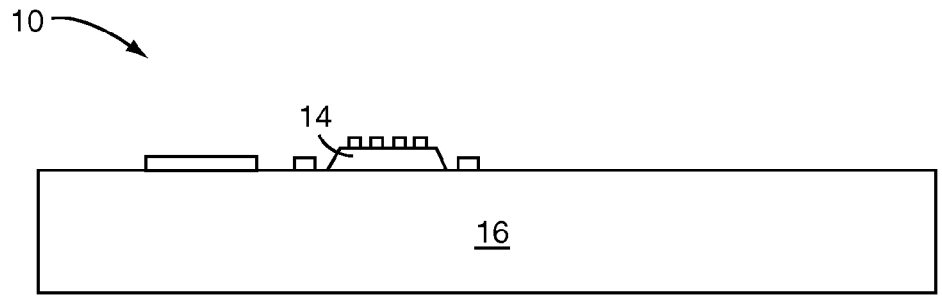
FIGS. 7-12 depict the process of manufacturing the integrated heat sink down configuration of the semiconductor device having a moisture protection metal enclosure according to one embodiment of the present invention.

With reference to the graphical representations of FIGS. 7-12, a manufacturing process for the IHSD semiconductor device 10 having a metal enclosure 60 is provided according to one embodiment of the present invention. Although the present invention may be applied to various types of device configurations, the following example provides the metal enclosure 60 in an IHSD configuration to illustrate a preferred implementation. The manufacturing process begins by creating the active devices 14 on the surface of the substrate 16 as shown in FIG. 7. The substrate 16 may be Gallium Arsenide, Gallium Nitride, Silicon, or the like.

Figure 8:
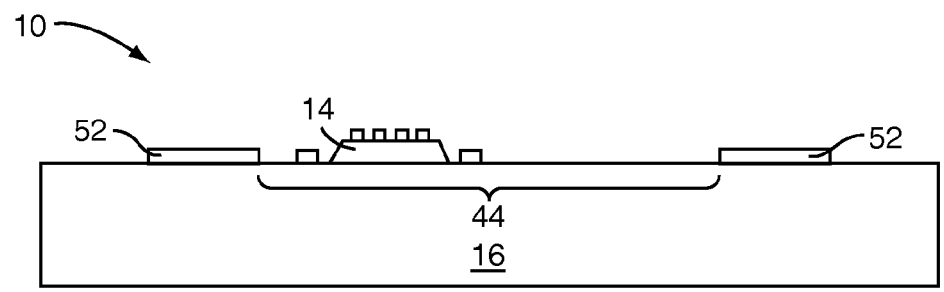

In FIG. 8, the ohmic contact ring 52 is formed on the surface of the substrate 16 and around the active device area 44. Notably, the ohmic contact ring 52 is formed where the guard ring 62 will be created. The ohmic contact ring 52, which may be a metal mixture such as a gold-germanium composite or the like, may be deposited onto the substrate 16 by sputtering, evaporation, or a similar process. Alternatively, the ohmic contact ring 52 may be Titanium-Aluminum-Nickel-Gold or the like when the substrate 16 is Gallium Nitride.

Figure 9:
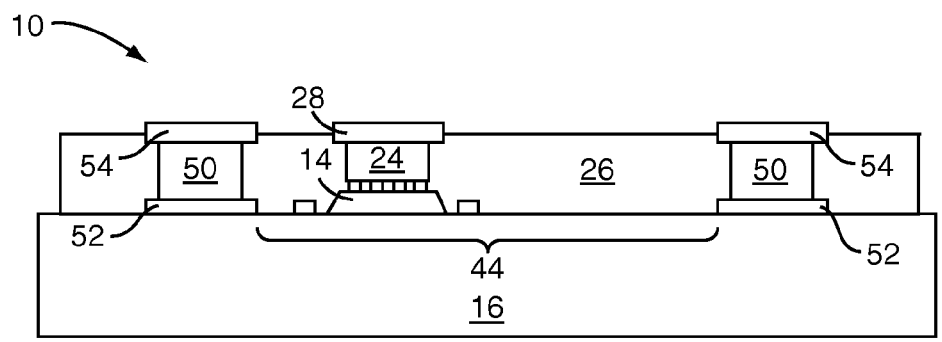

In FIG. 9, a first dielectric layer 26 is deposited over the active device 14 and the substrate 16. The first dielectric layer 26 may be silicon nitride, silicon dioxide, or the like, and may function to provide protection for the active device 14 from external devices. A trench is etched in the first dielectric layer 26, over the ohmic contact ring 52, wherein a metal-filled first via ring 50 is created. The metal-filled first via ring 50 is formed by filling or lining the first via ring 50 with a metal which may be Gold, Aluminum, or the like. As illustrated, a hole may be etched in the first dielectric layer 26 over the active devices 14 wherein a first via 24 is created. The first via 24 is formed by filling or lining the first via 24 with a metal which may be Gold, Aluminum, or the like.

A metal layer, which may be Gold, Aluminum, or the like may be deposited over the first dielectric layer 26. The metal layer is then etched to form the first metal pad 28 and the first metal trace ring 54. The first metal trace ring 54 is on the first via ring 50 and the first metal pad 28 may be on the first via 24.

Figure 10:
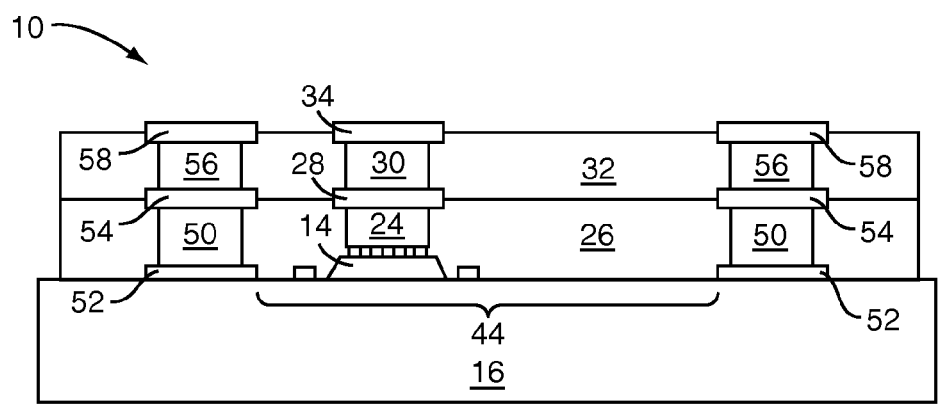

In FIG. 10, a second dielectric layer 32 is deposited over the first dielectric layer 26, the first metal pad 28, and the first metal trace ring 54. The second dielectric layer 32 may be silicon nitride, silicon dioxide, or the like. A trench is etched in the second dielectric layer 32, over the first metal trace ring 54, wherein a metal-filled second via ring 56 is created. The metal-filled second via ring 56 is formed by filling or lining the second via ring 56 with a metal which may be Gold, Aluminum, or the like. As illustrated, a hole may also be etched in the second dielectric layer 32 over the first metal pad 28, wherein a second via 30 is created. The second via 30 is formed by filling or lining the second via 30 with a metal, which may be Gold, Aluminum, or the like.

A metal layer, which may be Gold, Aluminum, or the like may be deposited over the second dielectric layer 32. The metal layer is then etched to form the second metal pad 34 and the second metal trace ring 58. The second metal trace ring 58 is on the second via ring 56 and the second metal pad 34 may be on the second via 30.

Figure 11:
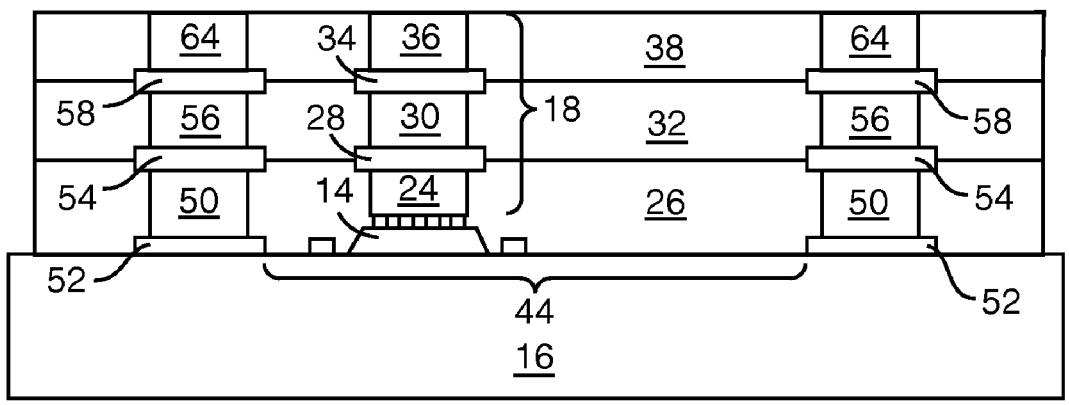

In FIG. 11, a third dielectric layer 38 is deposited over the second dielectric layer 32, the second metal pad 34, and the second metal trace ring 58. The third dielectric layer 38 may be silicon dioxide, silicon nitride, or the like, and may function to prevent moisture and mechanical damage during subsequent handling of the semiconductor device 10. A trench is etched in the third dielectric layer 38, over the second metal trace ring 58 wherein a metal-filled third via ring 64 is created. The metal-filled third via ring 64 is formed by filling or lining the third via ring 64 with a metal which may be Gold, Aluminum, or the like. As illustrated, a hole may also be etched in the third dielectric layer 38 over the second metal pad 34, wherein a third via 36 is created. The third via 36 is formed by filling or lining the third via 36 with a metal, which may be Gold, Aluminum, or the like.

Figure 12:
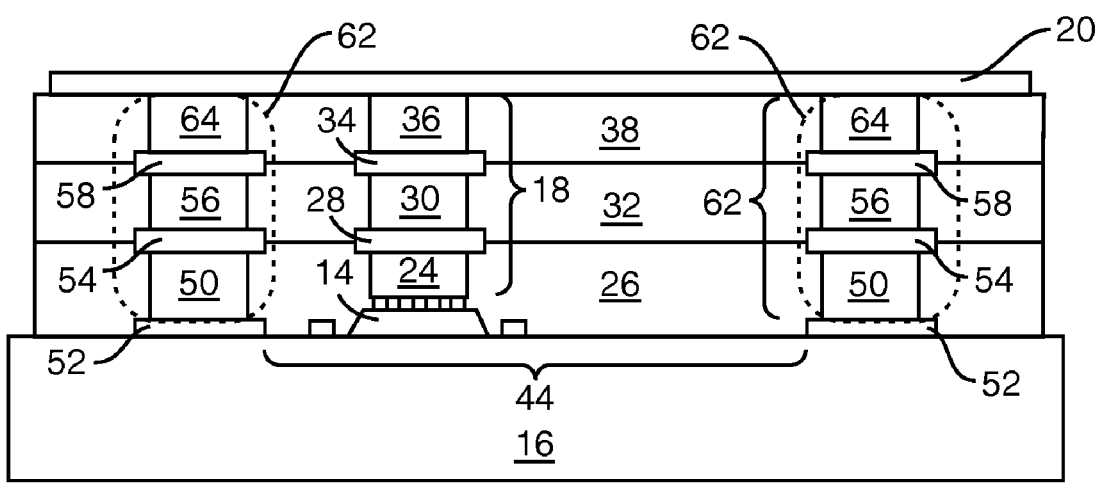

In FIG. 12, a metal layer, which may be made of Gold, Aluminum, or the like, is deposited over the third dielectric layer 38 and in contact with the guard ring 62. The metal is etched or processed to form a continuous metal panel 20 over the entire guard ring 62. This metal panel 20 may be a heat sink for the guard ring 62 and the active devices 14.

In the illustrated embodiment, the metal-filled first via ring 50, the first metal trace ring 54, the metal-filled second via ring 56, the second metal trace ring 58 and the metal-filled third via ring 64 form the guard ring 62 between the ohmic contact ring 52 on the surface of the substrate 16 and the metal panel 20. Notably, any number of metal filled via rings and metal trace rings may be used to form the guard ring 62. During the deposition process of each of the metal-filled via rings and the metal trace rings, the junction between each metal-filled via ring and metal trace ring is sealed in order to prevent moisture from penetrating the guard ring 62 and reaching the active devices 14. The Ohmic contact ring 52 may be annealed to provide a seamless seal between the substrate 16 and the guard ring 62. The ohmic contact ring 52 may allow electrical current to flow into or out of the substrate 16, while preventing moisture from entering the active device area 44 through the substrate-metal interface. During the deposition of the metal panel 20, the metal panel 20 and the guard ring 62 are substantially if not completely sealed. Moisture is prevented or substantially inhibited from penetrating the guard ring 62 where the metal panel 20 and guard ring 62 are sealed, and reaching the active devices 14. The substrate 16, guard ring 62, and metal panel 20 provide a substantially hermetically sealed enclosure to prevent moisture in a moisture path 12 from reaching the active devices 14.

Those skilled in the art will recognize improvements and modifications to the preferred embodiments of the present invention. All such improvements and modifications are considered within the scope of the concepts disclosed herein and the claims that follow.

What is claimed is:

1. A semiconductor device comprising:
   a substrate having a surface;
   a guard ring having a first gap around an active device area and over the surface of the substrate;
   an additional guard ring having a second gap around the guard ring, such that the second gap is substantially spaced apart from the first gap; and
   a metal panel over the guard ring such that a substantially hermetically sealed enclosure about the active device area is created by the guard ring, the metal panel, and the substrate, and an additional enclosure about the guard ring is created by the additional guard ring, the metal panel and the substrate.

2. The semiconductor device of claim 1 wherein the guard ring is a laminate of a plurality of metal rings formed from alternating at least one metal-filled via ring and at least one metal trace ring.

3. The semiconductor device of claim 1 further comprising an ohmic contact ring around the active device area and on the surface of the substrate, wherein the guard ring is formed on the ohmic contact ring to form a seal between the guard ring and the substrate.

4. The semiconductor device of claim 1 further comprising at least one dielectric layer over the active device area of the substrate, wherein the at least one dielectric layer is between the metal panel and the substrate.

5. The semiconductor device of claim 1 wherein the metal panel is a heat sink for an active device in the active device area.

6. The semiconductor device of claim 4 wherein the metal panel is formed by depositing a metal layer over the at least one dielectric layer and in direct contact with the guard ring.

7. The semiconductor device of claim 4 wherein the guard ring is formed within the at least one dielectric layer.

* * * * *